US012581913B1

(12) United States Patent
Wen et al.

(10) Patent No.: US 12,581,913 B1
(45) Date of Patent: Mar. 17, 2026

(54) STEADY-STATE IC THERMAL ANALYSIS WITH THERMAL DECAY CURVE CHARACTERIZATION

(71) Applicant: ANSYS, INC., Canonsburg, PA (US)

(72) Inventors: Jimin Wen, Pleasanton, CA (US); Hsiming Pan, San Jose, CA (US); Norman Chang, Fremont, CA (US); Haiyang He, Washington, PA (US); Mehdi Abarham, Belmont, CA (US); Akhilesh Kumar, Milpitas, CA (US); David Geb, Walnut Creek, CA (US); Saeed Asgari, Westborough, MA (US); Zhigang Feng, San Jose, CA (US); Wenbo Xia, Milpitas, CA (US); Viralkumar Girishchandra Gandhi, Nashua, NH (US)

(73) Assignee: ANSYS, INC., Canonsburg, PA (US)

( * ) Notice: Subject to any disclaimer, the term of this patent is extended or adjusted under 35 U.S.C. 154(b) by 639 days.

(21) Appl. No.: 17/659,346

(22) Filed: Apr. 15, 2022

Related U.S. Application Data

(60) Provisional application No. 63/253,369, filed on Oct. 7, 2021.

(51) Int. Cl.
*G06F 30/20* (2020.01)
*G06F 17/12* (2006.01)
*H01L 21/66* (2006.01)

(52) U.S. Cl.
CPC .............. *H01L 22/12* (2013.01); *G06F 17/12* (2013.01); *G06F 30/20* (2020.01); *H01L 22/00* (2013.01)

(58) Field of Classification Search
CPC ......... H01L 22/12; H01L 22/00; G06F 17/12; G06F 30/20
See application file for complete search history.

(56) References Cited

U.S. PATENT DOCUMENTS

| | | | |
|---|---|---|---|
| 10,371,583 B1 * | 8/2019 | Pan ........................... | G01K 7/42 |
| 11,334,700 B1 * | 5/2022 | Wakefield ............. | G06F 30/367 |
| 2007/0244676 A1 * | 10/2007 | Shang ..................... | G06F 30/23 |
| | | | 703/2 |

(Continued)

OTHER PUBLICATIONS

Sultan et al. (A Survey of Chip-level Thermal Simulators. ACM Computing Surveys. 52. 1-35. Apr. 2019. doi: 10.1145/3309544.) (Year: 2019).*

(Continued)

*Primary Examiner* — Lisa M Caputo
*Assistant Examiner* — Christian T Bryant
(74) *Attorney, Agent, or Firm* — WOMBLE BOND DICKINSON (US) LLP

(57) ABSTRACT

Methods and systems for improved simulation of thermal characterization and thermal modeling of devices, such as smart phones, are described. In one embodiment, a method can characterize center, edge, and corner thermal decay behavior at different locations on a simulated IC. For each location, near and far field thermal effects are captured at the same time. A simulation system can generate a steady state thermal decay curve for each selected location that shows how the temperature changes with distance to a heat source. The system can then use a set of location dependent thermal decay curves to compute, based on an inputted power profile for the IC, a steady state thermal profile of the IC.

20 Claims, 12 Drawing Sheets

(56)                          References Cited

U.S. PATENT DOCUMENTS

2012/0210285 A1*   8/2012   Kariat ................... G06F 30/23
                                                                   716/112
2013/0298101 A1*  11/2013   Chandra .............. G06F 30/398
                                                                   716/136

OTHER PUBLICATIONS

Wang et al. ("A System-Level Thermal Simulator with Automatic Meshing Techniques," 2018 17th IEEE Intersociety Conference on Thermal and Thermomechanical Phenomena in Electronic Systems (ITherm), San Diego, CA, USA, 2018, pp. 984-991, doi: 10.1109/ITHERM.2018.8419468.) (Year: 2018).*

Wen et al. ("DNN-based Fast Static On-chip Thermal Solver," 2020 36th Semiconductor Thermal Measurement, Modeling & Management Symposium (SEMI-THERM), San Jose, CA, USA, 2020, pp. 65-75, doi: 10.23919/SEMI-THERM50369.2020.9142855.) (Year: 2020).*

Yang et al. ("ISAC: Integrated Space-and-Time-Adaptive Chip-Package Thermal Analysis," in IEEE Transactions on Computer-Aided Design of Integrated Circuits and Systems, vol. 26, No. 1, pp. 86-99, Jan. 2007, doi: 10.1109/TCAD.2006.882589.) (Year: 2007).*

Barti et al. (Using Submodeling Technique To Understand Passivation Cracks In Microelectronic Devices Pre-processing with ANSA, Siemens AG, Infineon Technologies AG, 2nd ANSA & ¼ETA International Congress, Jun. 14-15, 2007) (Year: 2007).*

Swenson (âSubmodeling: Simple Solutions for Large-Scale Problemsâ, Nov. 23, 2016.) (Year: 2016).*

AnSys (Appdix B Submodeling Technique, Introduction to AnSys Mechanical, Feb. 27, 2015) (Year: 2015).*

\* cited by examiner

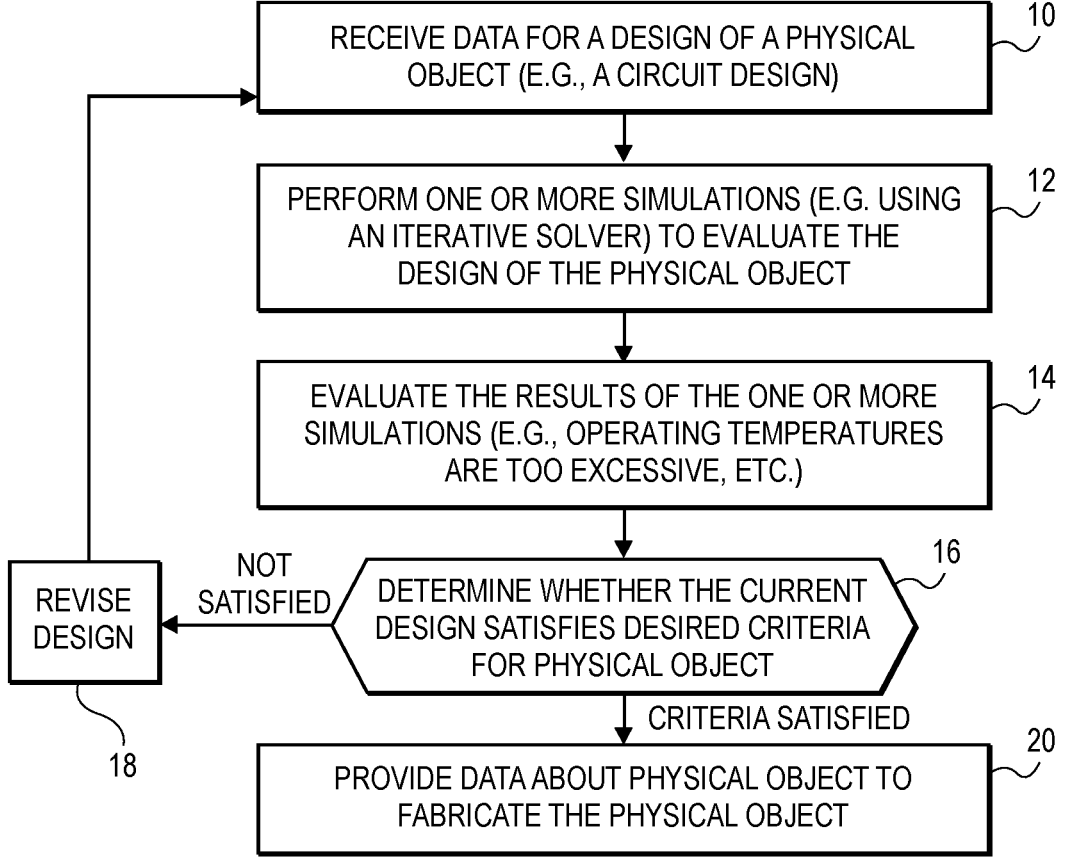

RECEIVE DATA FOR A DESIGN OF A PHYSICAL OBJECT (E.G., A CIRCUIT DESIGN) — 10

PERFORM ONE OR MORE SIMULATIONS (E.G. USING AN ITERATIVE SOLVER) TO EVALUATE THE DESIGN OF THE PHYSICAL OBJECT — 12

EVALUATE THE RESULTS OF THE ONE OR MORE SIMULATIONS (E.G., OPERATING TEMPERATURES ARE TOO EXCESSIVE, ETC.) — 14

DETERMINE WHETHER THE CURRENT DESIGN SATISFIES DESIRED CRITERIA FOR PHYSICAL OBJECT — 16

NOT SATISFIED

REVISE DESIGN — 18

CRITERIA SATISFIED

PROVIDE DATA ABOUT PHYSICAL OBJECT TO FABRICATE THE PHYSICAL OBJECT — 20

FIG. 1

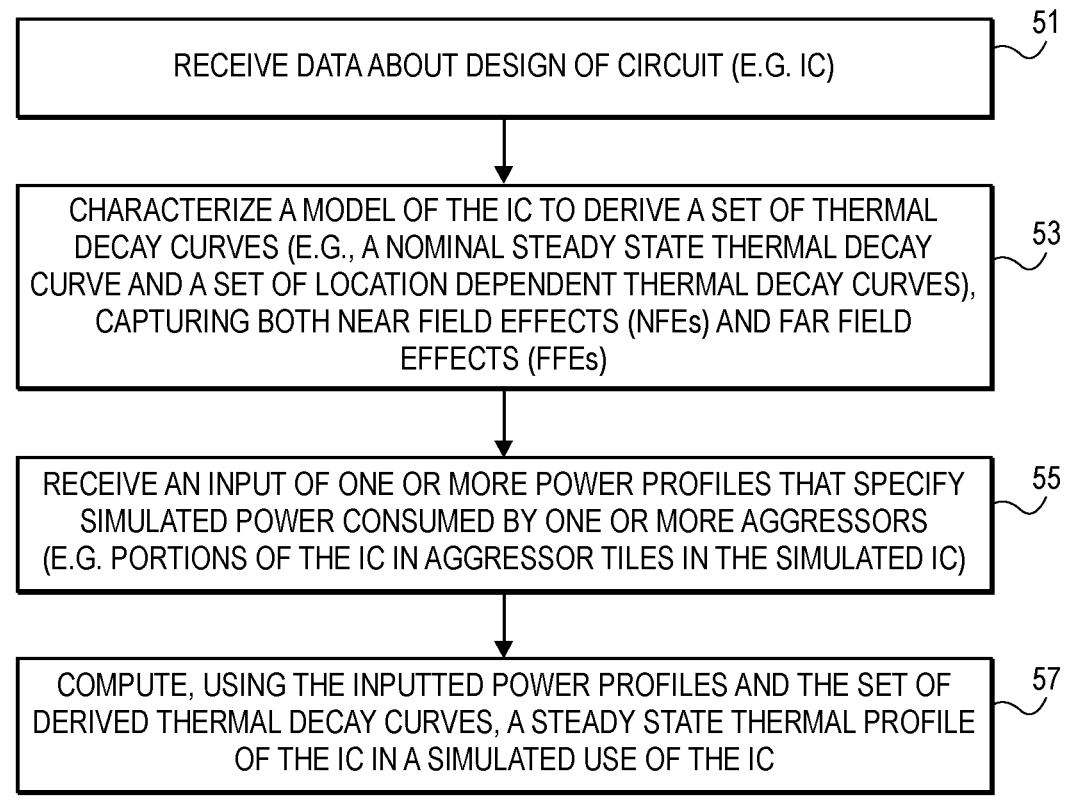

RECEIVE DATA ABOUT DESIGN OF CIRCUIT (E.G. IC)

51

CHARACTERIZE A MODEL OF THE IC TO DERIVE A SET OF THERMAL DECAY CURVES (E.G., A NOMINAL STEADY STATE THERMAL DECAY CURVE AND A SET OF LOCATION DEPENDENT THERMAL DECAY CURVES), CAPTURING BOTH NEAR FIELD EFFECTS (NFEs) AND FAR FIELD EFFECTS (FFEs)

53

RECEIVE AN INPUT OF ONE OR MORE POWER PROFILES THAT SPECIFY SIMULATED POWER CONSUMED BY ONE OR MORE AGGRESSORS (E.G. PORTIONS OF THE IC IN AGGRESSOR TILES IN THE SIMULATED IC)

55

COMPUTE, USING THE INPUTTED POWER PROFILES AND THE SET OF DERIVED THERMAL DECAY CURVES, A STEADY STATE THERMAL PROFILE OF THE IC IN A SIMULATED USE OF THE IC

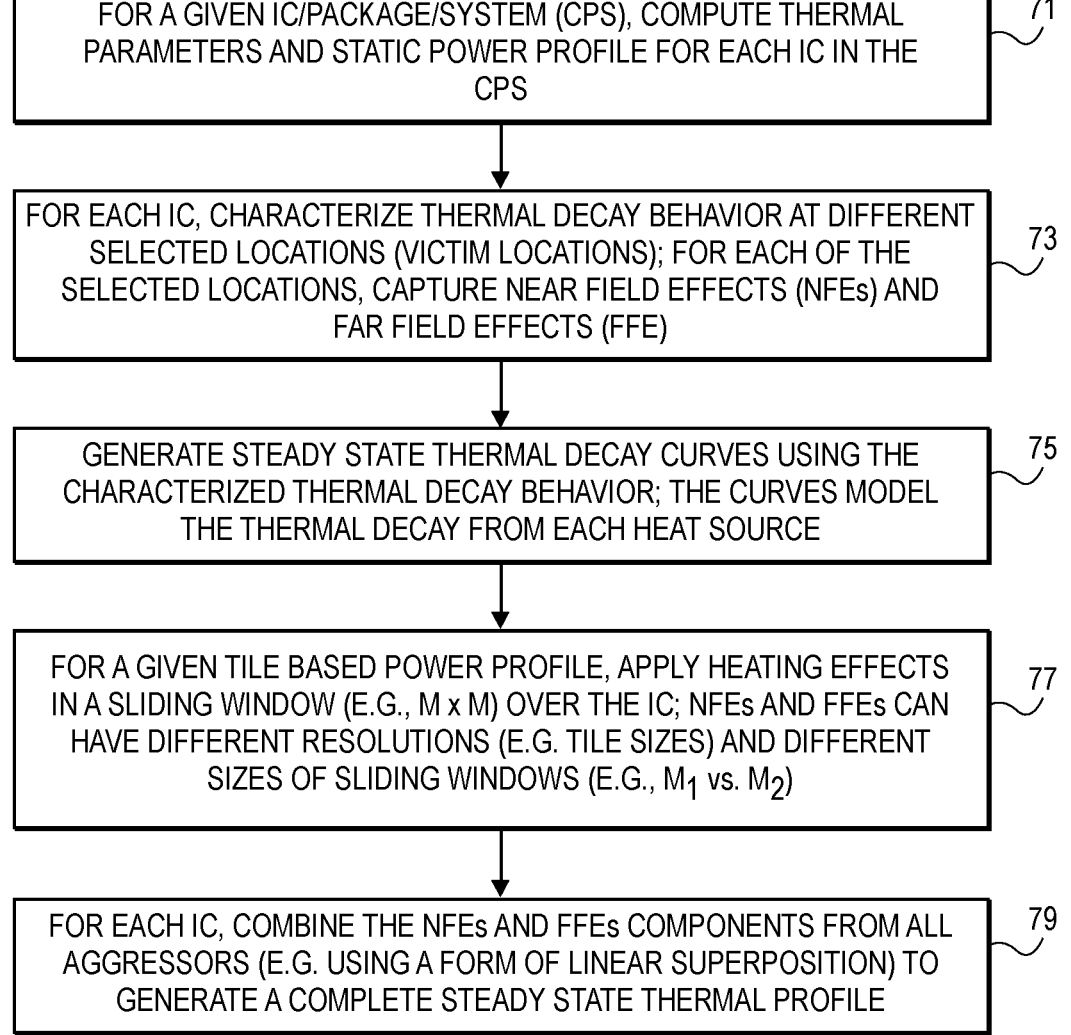

FOR A GIVEN IC/PACKAGE/SYSTEM (CPS), COMPUTE THERMAL PARAMETERS AND STATIC POWER PROFILE FOR EACH IC IN THE CPS — 71

FOR EACH IC, CHARACTERIZE THERMAL DECAY BEHAVIOR AT DIFFERENT SELECTED LOCATIONS (VICTIM LOCATIONS); FOR EACH OF THE SELECTED LOCATIONS, CAPTURE NEAR FIELD EFFECTS (NFEs) AND FAR FIELD EFFECTS (FFE) — 73

GENERATE STEADY STATE THERMAL DECAY CURVES USING THE CHARACTERIZED THERMAL DECAY BEHAVIOR; THE CURVES MODEL THE THERMAL DECAY FROM EACH HEAT SOURCE — 75

FOR A GIVEN TILE BASED POWER PROFILE, APPLY HEATING EFFECTS IN A SLIDING WINDOW (E.G., M x M) OVER THE IC; NFEs AND FFEs CAN HAVE DIFFERENT RESOLUTIONS (E.G. TILE SIZES) AND DIFFERENT SIZES OF SLIDING WINDOWS (E.G., $M_1$ vs. $M_2$) — 77

FOR EACH IC, COMBINE THE NFEs AND FFEs COMPONENTS FROM ALL AGGRESSORS (E.G. USING A FORM OF LINEAR SUPERPOSITION) TO GENERATE A COMPLETE STEADY STATE THERMAL PROFILE — 79

FIG. 2B

```
┌──────────────────────────────────┐
│          121                     │
│                                  │
│  ┌───────────────────────┐  123  │
│  │   INTERCONNECTION     │       │
│  │      LAYERS           │       │
│  ├───────────────────────┤  125  │
│  │     DIELECTRIC        │  127  │
│  │      LAYERS           │       │
│  ├───────────────────────┤       │
│  │                       │       │
│  │      SILICON          │  129  │
│  │     SUBSTRATE         │       │
│  │                       │       │
│  └───────────────────────┘       │
└──────────────────────────────────┘
```

$$T = DT + T_{AMB}$$

$$DT = DT_{NFE} + DT_{FFE} = \sum_{range_{NFE}} DTN_i + \sum_{range_{FFE}} DTF_j$$

$$DTN_i = \frac{PN_i}{P_{curve}} \times DT_{decay}(d_i)$$

$$DTF_j = \frac{PF_j}{P_{curve}} \times DT_{decay}(D_j, L_{l,c,e}, K)$$

FIG. 4A

$k_{(\mu)} \times k_{(\mu)}$ tiles $L_{(\mu)} \times L_{(\mu)}$ tiles

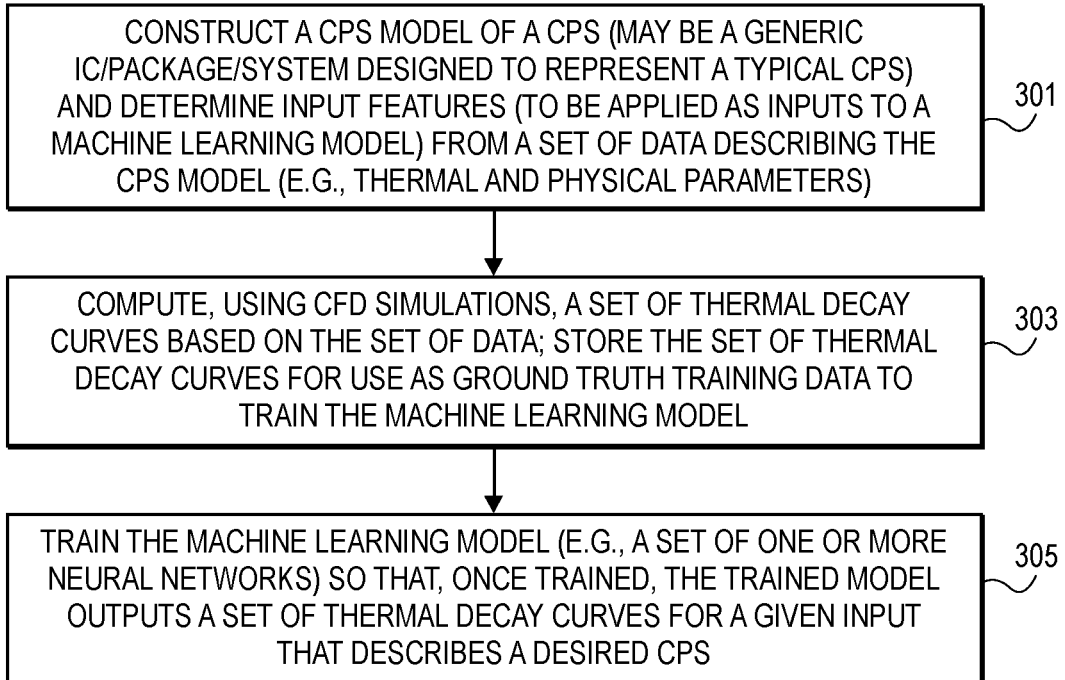

CONSTRUCT A CPS MODEL OF A CPS (MAY BE A GENERIC IC/PACKAGE/SYSTEM DESIGNED TO REPRESENT A TYPICAL CPS) AND DETERMINE INPUT FEATURES (TO BE APPLIED AS INPUTS TO A MACHINE LEARNING MODEL) FROM A SET OF DATA DESCRIBING THE CPS MODEL (E.G., THERMAL AND PHYSICAL PARAMETERS) — 301

COMPUTE, USING CFD SIMULATIONS, A SET OF THERMAL DECAY CURVES BASED ON THE SET OF DATA; STORE THE SET OF THERMAL DECAY CURVES FOR USE AS GROUND TRUTH TRAINING DATA TO TRAIN THE MACHINE LEARNING MODEL — 303

TRAIN THE MACHINE LEARNING MODEL (E.G., A SET OF ONE OR MORE NEURAL NETWORKS) SO THAT, ONCE TRAINED, THE TRAINED MODEL OUTPUTS A SET OF THERMAL DECAY CURVES FOR A GIVEN INPUT THAT DESCRIBES A DESIRED CPS — 305

FIG. 5A $\{x_1, x_2, \ldots x_m\}$ are "sensors"

$u$ is input function $G$ is an operator $G(u)$ is the output function $y$ is point in the domain of $G(u)$ $G(u)(y)$ is a real number

- Network input and output

- Network structure $G(u)(y)$

Branch net

Trunk net $u(x_1)$
$u(x_2)$
$\vdots$
$u(x_m)$ $u$ $y$

DeepONet

USE INITIAL POWER PROFILE (E.G., POWER DENSITY PER TILE) TO DERIVE INITIAL THERMAL PROFILE (E.G., INITIAL TEMPERATURES)    401

UPDATE THE POWER PROFILE BASED ON TEMPERATURE OF EACH TILE (E.G., INCREASED TILE TEMPERATURES CAUSES TILE TO CONSUME MORE POWER)    403

COMPUTE NEW TEMPERATURES USING THE UPDATED POWER PROFILE    405

407

NO    SOLUTION HAS CONVERGED?

YES

DONE    409

STEADY-STATE IC THERMAL ANALYSIS WITH THERMAL DECAY CURVE CHARACTERIZATION

BACKGROUND

This application claims the benefit of the filing date of U.S. provisional patent application No. 63/253,369, which was filed on Oct. 7, 2021 by Applicant Ansys, Inc., and this US provisional patent application is hereby incorporated herein by reference.

Modern data processing systems, such as smartphones, laptop computers, tablet computers, etc. include many components, such as integrated circuits (ICs) and other devices that generate heat that can cause these systems to reach excessive temperatures. These excessive temperatures directly impact electromigration in ICs, timing in the ICs (e.g., the data processing operations become slower), and other effects on the system. Moreover, the excessive temperatures may harm users of such systems. Thus, designers of such systems attempt to analyze a system's thermal characteristics prior to fabricating the system by using simulation tools. However, conventional finite element methods and computational fluid dynamics (CFD) simulation tools are very time consuming to obtain a detailed thermal profile. It is difficult for current thermal modeling systems to achieve simulation results for thermal static responses in a practical time frame due to excessive computational requirements using existing computational fluid dynamics and finite element techniques. 3D IC packaging further complicates the computations needed for the different levels in a system.

SUMMARY OF THE DESCRIPTION

This disclosure describes methods and simulation systems for improving simulation of dynamic thermal characterization and thermal modeling of devices, such as smartphones. In one embodiment, a method can characterize center, edge, and corner thermal decay behavior at different locations on a simulated IC. For each location, near and far field thermal effects are captured at the same time. A simulation system can generate a nominal thermal decay curve and a set of thermal decay curves such as a steady state thermal decay curve for each selected location that shows how the temperature changes with distance to a heat source for that selected location.

In one embodiment, a method can include the following operations: characterizing a model of an integrated circuit (IC) to derive a set of thermal decay curves which comprise a nominal steady state thermal decay curve model and a set of location dependent thermal decay curves, wherein the set of thermal decay curves distinguish between near field thermal effects (NFEs) and far field thermal effects (FFEs); receiving an input of a power profile of the IC; and computing, using the input of the power profile and the nominal steady state thermal decay curve and the set of location dependent thermal decay curves, a steady state thermal profile of the IC in a simulated use based on the power profile. In one embodiment, the characterizing comprises a set of computational fluid dynamics (CFD) thermal simulations to derive steady state temperatures based on simulated power being applied to selected locations in the model of the IC. In one embodiment, the selected locations can include one or more locations near a center of the IC and near an edge of the IC and near a corner of the IC. In one embodiment, the model of the IC is simplified to contain only three layers respectively representing a semiconductor substrate, interconnection layers and dielectric layers. In one embodiment, the NFEs are computed at a first resolution and the FFEs are computed at a second resolution, and the first resolution is finer grain than the second resolution. In one embodiment, computing the steady state thermal profile of the IC combines the NFEs and FFEs of all aggressors using linear superposition. In one embodiment, the FFEs are a function of location relative to the IC, including location relative to a corner of the IC or an edge of the IC. In one embodiment, the NFEs are a function of distance from a victim location to a center of the IC. In one embodiment, a first FFE at a first location uses a first location dependent thermal decay curve computed for the first location, and a second FFE at a second location uses a second location dependent thermal decay curve computed for the second location, and wherein the first location dependent thermal decay curve is different than the second location dependent thermal decay curve. In one embodiment, the computing uses a trained set of one or more neural networks to compute the steady state thermal profile of the IC.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 1 is a flowchart that shows a method of using one or more embodiments described herein to design a circuit and to evaluate the circuit, such as a system of one or more packaged ICs in the system.

FIG. 2A is a flow chart that shows a method according to one embodiment described herein.

FIG. 2B is a flow chart that shows another method according to an embodiment described herein.

FIG. 4A shows an example of how both near field effects (NFEs) and far field effects (FFEs) can be computed and combined to yield a set of final temperatures at one or more tiles of an IC.

FIG. 5A shows an example of a method for training a machine learning model according to one embodiment.

DETAILED DESCRIPTION

Figures 3A, 3B:
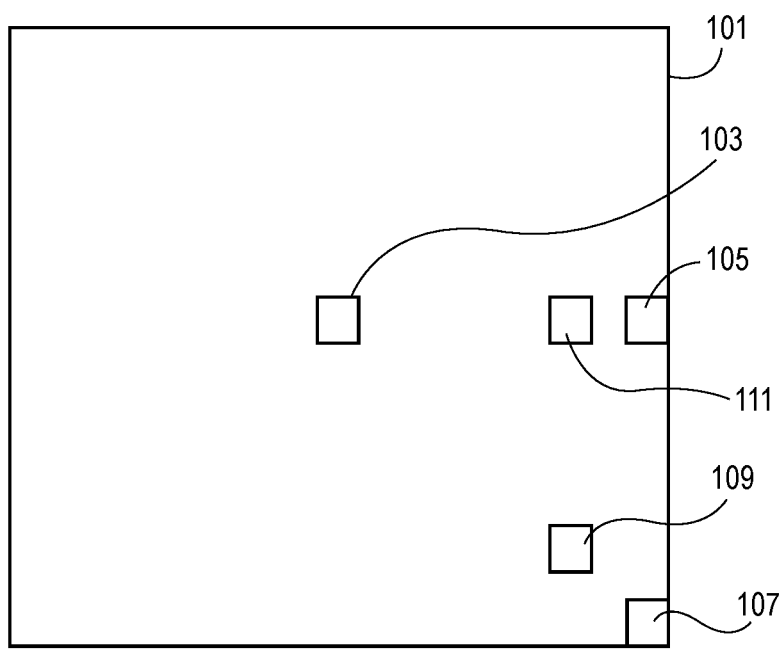
FIG. 3A shows an example of a characterization process involving selected locations on a simulated design of an IC.
FIG. 3B shows an example of a simplified model of a structure of an IC that may be used during the thermal characterization that generates thermal training data according to one embodiment.

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

The embodiments described herein can be used in simulations of electrical circuits (for example, an IC or set of ICs in a system) in order to determine whether a particular design of the IC (or set of ICs in the system) satisfies particular thermal requirements for the circuit or system containing the circuit. For example, there might be certain design requirements relating to a maximum temperature ("hot spot") at one or more points in a system and in each of the one or more ICs. The system may be used over a period of time (e.g., 2 minutes or 10 minutes) in various different ways that consume varying levels of power, resulting in varying temperatures over time on points on the system. FIG. 1 shows a method in which these design requirements can be tested, during simulation, relative to a particular design of an IC which is being simulated. In operation 10 of FIG. 1, a data processing system (e.g., a computer executing simulation software to provide a simulation system) can receive data about a design for a particular set of one or more ICs and associated IC packages or and other system components such as a printed circuit board (PCB). This data can be similar to the data inputted into Icepak from Ansys, Inc. of Canonsburg, Pennsylvania. The data can be created in CAD (computer aided design) software on a data processing system, and the data can include cell library information, other timing information and information about the geometry of the IC, pins and nets in the IC and information about the materials in the conductors and dielectrics (e.g., silicon dioxide, etc.) and sizes of the conductors and dielectrics, etc. Then in operation 12, the data processing system can perform one or more simulations (such as simulations based on physical models of the one or more ICs and associated IC packages and PCB) to evaluate the design of the IC and system by determining, for example, transient thermal data (such as changes in temperature values over time in the one or more ICs and in the system) during the simulated operation of the system. These simulations can use the aspects and embodiments described herein. In operation 14, the designer can evaluate the results of one or more simulations to determine whether the design of the one or more ICs and the system satisfies certain desired criteria for the design. This determination is shown in operation 16. If the one or more criteria is satisfied, then the designer in operation 20 can provide data about the circuit to allow the fabrication or manufacture of the IC or system. For example, if the one or more criteria are satisfied, a CAD file can be produced that describes how to build the one or more ICs and the system. If the criteria are not satisfied as determined in operation 16, the designer can revise the design in operation 18 (for example, by changing sizes and/or quantity of the heat sinks and other cooling mechanisms and/or changing the design of circuits in one or more ICs, etc.) and repeat the process by performing additional further simulations to evaluate the redesigned circuit. This can be repeated until the desired criteria are achieved for the circuit.

FIG. 2A shows an example of a method according to one embodiment. This method can be used to compute one or more steady state thermal profiles of an IC or a set of ICs in a chip/package/system (CPS). Each steady state thermal profile can include a set of temperatures over a set of tiles on each IC that represent the effect of operating the IC (by applying simulated power to aggressor tiles on the IC and computing the resulting increase in temperature of each of the victim tiles). The method can begin in operation 51 which involves the collection or generation of data about the IC (or CPS) that can be used to perform thermal characterization of the IC. This data can include the conventional data used as inputs in thermal CFD simulations in, for example, Icepak from Ansys, Inc. of Canonsburg, Pennsylvania. For example, this data can include cell library information, information about the geometry and layout of each of the one or more ICs, pins and nets in the IC, thermal information about the IC (e.g., thermal conductivity values) and information about the materials in the conductors and dielectrics (e.g., silicon dioxide, etc.) and sizes of the conductors and dielectrics, and other materials in the structure of the IC, etc., and also this data can include PCB layout geometry, 3D CAD system geometry, and system heat sources and sinks of a system level description. The characterization can use a conventional semiconductor model (e.g., a silicon block die model) for the structure of the IC or a simplified model such as a 3 layer model 121 shown in FIG. 3B. In the model 121 of the IC shown in FIG. 3B, the silicon substrate 129 is the largest layer, followed, in size, by a layer 123 representing all of the numerous interconnection layers (e.g., metal conductors) in a typical IC. The numerous insulation and dielectric layers are represented by layer 127. Finally, the device layer 125 (containing the transistors, diodes and other electrical components) is part of the structure but may not be considered as significantly contributing to the thermal properties (e.g., thermal conductivity) of the structure. The 3 layer model can capture additional thermal resistance that is expected to better capture chip hot spots when fine grain power maps are modeled. In one embodiment of this 3 layer model, the interconnection layer 123 can be 6 microns in thickness, the insulation layer 127 can be 50 nanometers in thickness, and the silicon substrate layer 129 can be 100 microns in thickness.

Once the data from operation 51 is obtained or generated, a simulation system can characterize, in operation 53, a model of the IC (or CPS) to derive a set of thermal decay curves, such as a nominal steady state thermal decay curve and a set of location dependent thermal decay curves, and during this characterization, the simulation system captures data about both near field effects (such as thermal effects near a victim tile derived from the nominal steady state thermal decay curve) and far field effects. The characterization, in one embodiment, can use thermal CFD simulations to determine both near field effects (NFEs) and far field effects (FFEs). Thus, the process decomposes the thermal characterization of the IC into thermal NFEs and thermal FFEs, and the thermal profile is constructed from the combination of these NFEs and FFEs. The set of location dependent thermal decay curves can depend upon (e.g., are a function of) the location of a tile (e.g., a victim tile); for example, a victim tile in a corner of an IC (e.g., tile 107 on the IC 101 in FIG. 3A) may have a first steady state decay curve (caused by simulated power applied to the center tile 103 on the IC 101) that is different than a second steady state decay curve (caused by simulated power applied to the center tile 103) for a victim tile (e.g., tile 105 in FIG. 3A) along an edge (but not a corner) of the IC. In other words, a steady state thermal decay behavior can depend upon the location of a tile relative to the physical boundaries of the IC; tiles near the center of the IC may have one type of steady state thermal decay curve while tiles at the corner and tiles along an edge have other types of steady state thermal decay curves. This type of steady state thermal decay curve can be referred to as a location dependent thermal decay curve. In general, a location dependent steady state thermal decay curve represents the change in temperature over the IC based on distance from a heat source. The farther away from the heat source, the smaller the change in steady state temperature caused by heat generated by the heat source. Thus, operation 53 can produce a set of location dependent thermal decay curves and at least one nominal thermal decay curve from the thermal CFD simulations that can characterize the IC, and this characterization can provide the steady state thermal decay curves. The set of thermal decay curves (e.g., the set of location dependent steady state thermal decay curves and at least one nominal steady state thermal decay curve) from operation 53 can be used with an input, in operation 55, of one or more power profiles that describe power levels in aggressor tiles that cause victim tiles to be heated in response to the power applied in the aggressor tiles.

Once the thermal decay curves are derived in operation 53 and the one or more power profile inputs in operation 55 are received, they can be used in operation 57 to compute a steady state thermal profile of the IC in a simulated use of the IC. An example is provided below of the computations in operation 57 to compute a steady state thermal profile from NFEs and FFEs implicit in the derived thermal decay curves (derived in operation 53).

Figure 4B:
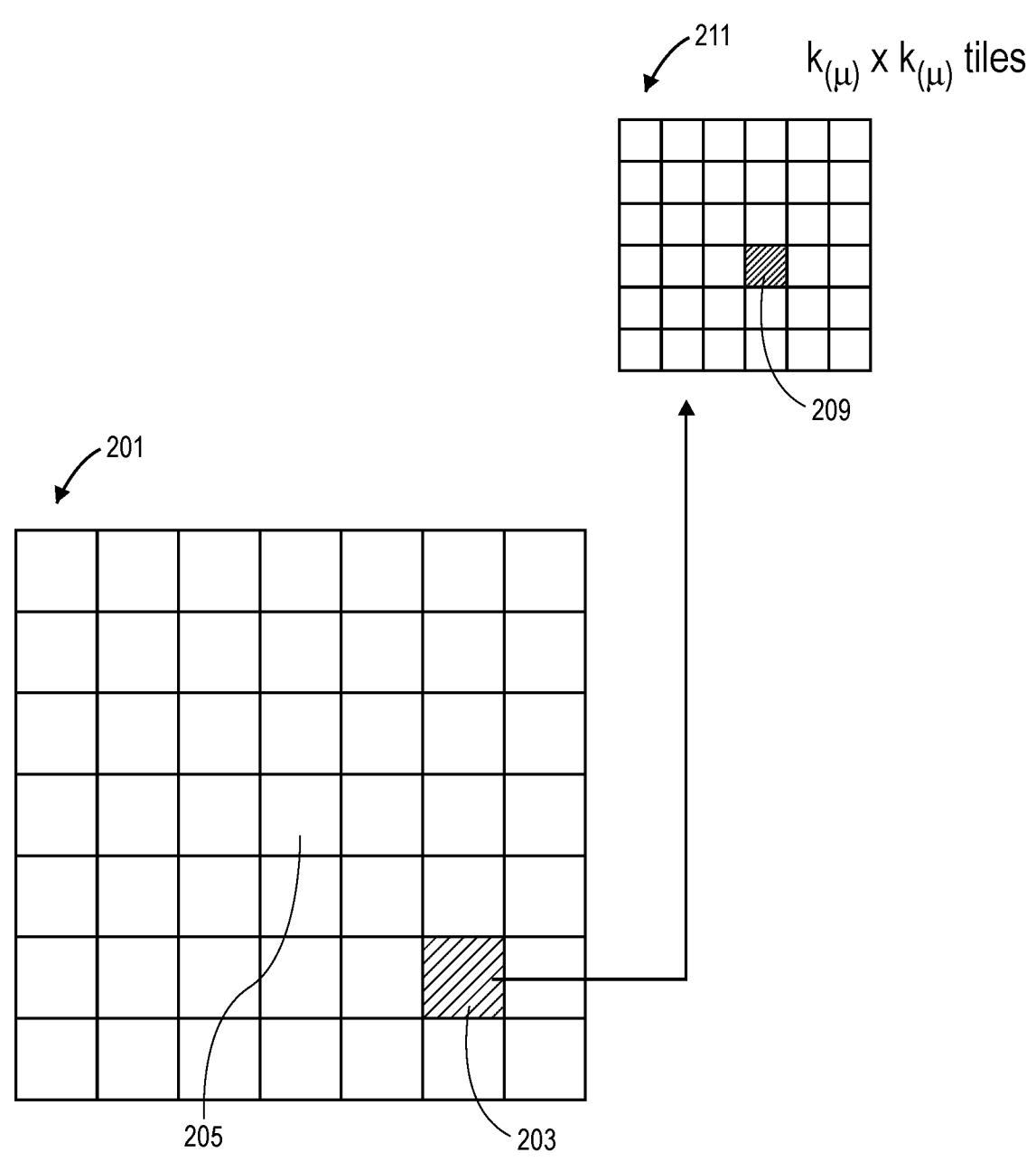
FIG. 4B shows an example of tiles in both NFEs and FFEs according to one embodiment.

Another example of a method according to an embodiment is shown in FIG. 2B. In the example in FIG. 2B, the method can use a plurality of selected locations to characterize the thermal behavior of the IC while capturing thermal NFEs and thermal FFEs at the selected locations. The selected locations can be dispersed around the entire die of the IC in order to capture a representative sample over the entire surface of the die; the selected locations may be less than all possible locations on the die. The FFEs can be captured at a first resolution while the NFEs can be captured at a second resolution that provides a finer grain detailed description of the thermal effects than the first resolution (as shown in FIG. 4B). In the example in FIG. 4B, the thermal FFEs are captured over a set of tiles 201 with a resolution defined by a tile size of L by L microns (e.g., the tile 203 is a square that is L microns in width and L microns in length and the center tile 205 is a square that is L by L microns) while the thermal NFEs are captured in a set of tiles 211 (including tile 209) with a resolution defined by a tile size of K by K microns, where K is smaller than L. For example, K may be 10 microns while L may be greater than 20 microns (e.g., L=100 or L=60 microns). The FFEs can include a set of tiles (e.g., the set of tiles 201) that cover the entire die of the IC while the NFEs set of tiles for a particular victim tile does not cover the entire die (rather it covers only a portion of the IC around the victim tile and may cover only a very small portion of the IC). As shown in the example in FIG. 4B, the tile 203 contains the set of tiles 211 which is 6 by 6 tiles, each of which is a square of K by K microns.

Referring back to FIG. 2B, in operation 71 a simulation system can determine or compute or obtain thermal parameters and static power profile information for each IC in the CPS; these parameters and other information can be similar to the thermal and power inputs applied to Icepak to perform thermal simulations of a simulated IC having the thermal parameters. The parameters and power profile can be similar to the information received in operation 51 in FIG. 2A. In one embodiment, these thermal parameters and power profile information can include: data about the length, width and thickness of the die; one or more heat transfer coefficients (HTC e.g., an HTC at the top of the die and an HTC at the bottom of the die); power per tile data (e.g., 0.01 to 15 mW per tile); the average thickness of dielectric layers or total thickness of all of the dielectric layers; the average thickness of conducting layers or the total thickness of all of the conducting layers; tile size of each tile at the FFE resolution; tile size of each tile at the NFE resolution and the number of tiles at the NFE resolution around a victim tile; thermal conductivity (e.g., K) of the semiconductor substrate; thermal conductivity of the dielectric layers (e.g., an average K for the dielectric layers); and thermal conductivity of the conducting layers (e.g., an average K for the conducting layers).

These thermal parameters and other information can then be used as inputs in the characterization operation 73 by a simulation system that performs a set of thermal CFD simulations (such as thermal CFD simulations using Icepak from Ansys, Inc.). In operation 73, the simulation system can use the results of the thermal CFD simulations to characterize steady state thermal decay behavior (e.g., how temperature changes at a set of victim tile locations as a function of distance from a steady state heat source, such as a heat source at the center of the die) at selected locations such as selected victim locations dispersed across the die. FIG. 3A shows an example of a small set of selected locations on die 101; in practice, more selected locations may be used (and it may be desirable in some embodiments to select almost all or all tiles in the die). The selected locations in this example in FIG. 3A include: the center tile 103, edge tile 105, corner tile 107, near corner tile 109, and near edge tile 111. For each of the selected locations, the thermal CFD simulations are used to obtain both thermal FFEs (at the FFE resolution) and thermal NFEs (at the NFE resolution). Separate CFD simulations can be performed at each of the two resolutions. The tile sizes determine the resolutions. In one embodiment, the thermal NFEs are captured only locally around each selected location, while thermal FFEs are captured over the entire surface of the IC. The thermal CFD simulations will provide steady state temperature data, based on the amount of simulated power applied to the heat source (e.g., a tile at the center of the die), as a function of the location on the die (e.g., distance from the center of the die) at each of the selected locations. This steady state temperature data can then be used by the simulation system in operation 75 to generate steady state thermal decay curves. These generated steady state decay curves can then be used to generate thermal profiles of the IC (or set of ICs in a CPS) in operations 77 and 79 in FIG. 2B.

In operation 77, a simulation system can, for a given tile-based power profile (used as a simulated power input), apply the heating effects caused by this inputted power in a sliding window over the IC using the steady state decay curves generated in operation 75; these heating effects are determined at both the set of NFEs and the set of FFEs which may use different sliding windows and different resolutions. In one embodiment, the NFEs each use the same nominal thermal decay curve (derived from CFD simulations at the NFE resolution) in operation 77 to derive the heating effects, and each of the FFEs in the set of FFEs use a location dependent thermal decay curve (generated for the location from operations 73 and 75) to derive heating effects. A scaling function, as described below, can be used to scale the appropriate thermal decay curve based on the per tile inputted power. Then, in operation 79, the simulation system can combine the NFEs and FFEs from all aggressors (e.g., using a form of linear superposition) to generate a complete steady state thermal profile of the IC for a given tile-based power profile. This steady state thermal profile indicates the steady state temperatures at the selected locations of the die based upon the application of simulated power at the selected locations. FIG. 4A shows an example of the computations that can be used in operations 77 and 79 to generate a complete steady state thermal profile at each tile in a set of tiles, which may be the selected locations (or all tiles) in the die.

As shown in FIG. 4A, the steady state temperature (T) at a victim tile (e.g., one of the victim tiles in one of the selected locations) is the sum of a change in temperature (DT) and the ambient temperature $T_{AMB}$. The change in temperature (DT) is the sum (at the victim tile) of change in temperature from NFEs ($DT_{NFE}$) and change in temperature from FFEs ($DT_{FFE}$). For each element of the sum for NFEs, the power value of the per tile simulated power applied to the tile is scaled by dividing the power of the victim tile ($PN_i$) by the power value used in generating the nominal decay curve (for the NFEs). This scaled power is multiplied by the thermal value from the nominal decay curve at the distance ($d_i$) of the victim tile to the aggressor tile (e.g., the center of die tile); thus, $DT_{decay}$ ($d_i$) is the change in temperature value extracted from the nominal thermal decay curve at the distance $d_i$ for an element of the sum of NFEs. The nominal steady state thermal decay curve represents a standard thermal decay curve for local regions of the IC (at NFE resolution), and this standard thermal decay curve is assumed to be not dependent upon the location of the tile on the IC (e.g., relative to the edge or corner or center of the IC). This nominal thermal decay curve can be derived from the thermal CFD simulations at the NFE resolution and can be considered to be a short range version of a thermal decay curve for the IC). In one embodiment, this nominal thermal decay curve does not depend on the location of the victim tile. For each element of the sum from the FFEs ($DT_{FFE}$), the power value of the per tile simulated power applied to the tile ($PF_j$) is scaled by dividing the power ($PF_j$) of the victim tile (tile j) by the power value ($P_{curve}$) used in deriving the particular location dependent power curve for tile j. This scaled power value is multiplied by the change in thermal value ($DT_{decay}$ ($D_j$, $L_{l,c,e}$, K)) extracted (in operation 77 in FIG. 2B) from one of the location dependent decay curves (in other words, the location dependent decay curve for tile j). In one embodiment, the location dependent thermal decay curve value $\{(DT_{decay}$ ($D_j$, $L_{l,c,e}$, K))\}$ can be expressed or computed as a function of the location of the tile j. In one embodiment, the location dependent thermal decay curve value $DT_{decay}(D_j, L_{l,c,e}$, K) can be computed based on the following expression: $DT_{decay}(D_j, L_l)=DT_{decay}(D_j, L_o)\times F$ ($L_l$, $L_c$, $L_e$, $Ang_v)\times\beta(K)$, where $DT_{decay}(D_j, L_{l,c,e}$, K)= $DT_{decay}(D_j, L_l)$. In this expression, the FFE is a function of the location of the tile on the die and the angle of the victim to the aggressor tile and also thermal conductivity of the tiles. In one embodiment, in this expression, $DT_{decay}$ ($D_j, L_o$) is the nominal decay curve with the aggressor at the center tile, and $D_j$ is the distance of victim j to the aggressor l, and $L_l$ is the distance of aggressor l to the center of the die, so $L_o$=0 which means the aggressor located at the center of die, and $L_c$ is the distance of aggressor l to the nearest die corner, and $L_e$ is the distance of aggressor l to the nearest die edge, and $Ang_v$ is the angle between the vector of aggressor to victim and the x-axis, F is a function of the aggressor distance to the die center, the nearest corner, the nearest edge, and the angle to the victim. The function F can be implemented in a trained neural network in one embodiment. The function $\beta(K)$ can be a function of equivalent thermal conductivity (e.g., equivalent K or metal density or HTC) at different tile locations, and in one embodiment, this function can be implemented in a trained neural network.

Figure 3C:
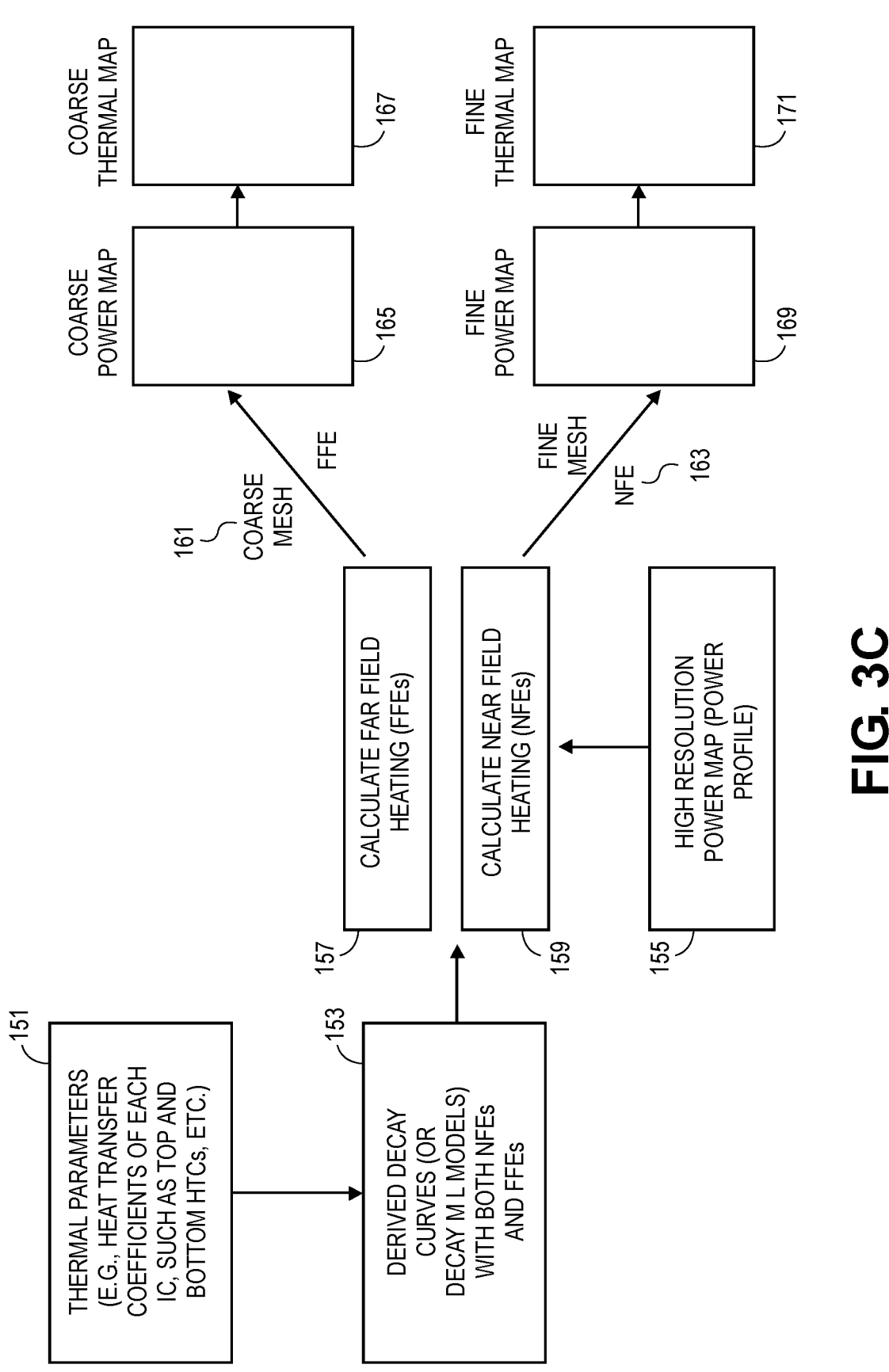
FIG. 3C shows an example of a method that uses both near field effects and far field effects to determine a final thermal model of a system.

FIG. 3C provides a summary of one embodiment that can use the method shown in FIG. 2B. The input data 151 is computed or otherwise obtained to provide the thermal parameters (e.g., HTC parameters, die geometry, etc.) that are used to derive, in 153, thermal decay curves (or decay machine learning models as described below), where these curves include both FFEs (e.g., in the form of location dependent thermal decay curves) and NFEs. A power profile 155 is received and used in 157 to calculate far field heating effects (FFEs) and is received and used in 159 to calculate near field heating effects (NFEs). The calculated FFEs are calculated over a coarse mesh 161 based on a coarse power map 165 to produce a coarse thermal map 167 (e.g., a set of temperatures over the coarse resolution map). The calculated NFEs are calculated over a fine mesh 163 based on a fine power map 169 to produce a fine thermal map 171 (e.g., a set of temperatures over the fine resolution map). Hence, the two sets of calculations at different resolutions (and potentially with different power maps at the different resolutions) produce the fine and coarse thermal maps that can be combined into the final steady state thermal profile in operation 79.

Figure 5B:
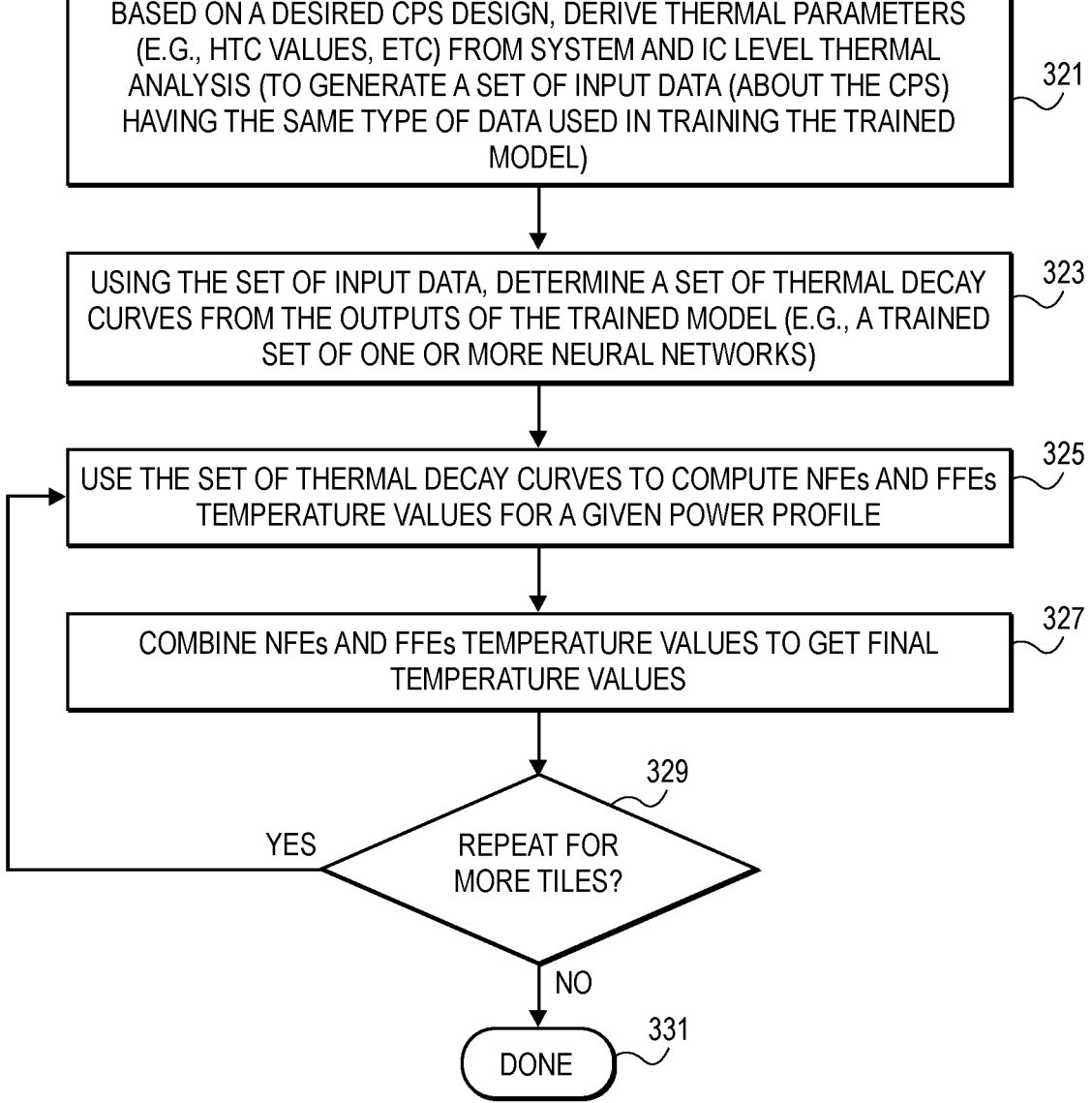
FIG. 5B shows an example of a method for using a trained machine learning model according to one embodiment.
Figure 5C:
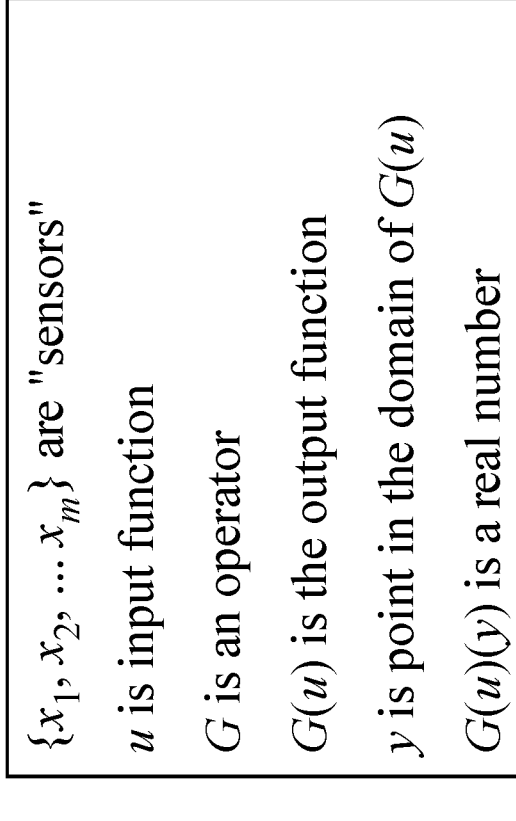
FIG. 5C shows an example of a neural network that can be used as an embodiment of a machine learning model.

An alternative embodiment may use machine learning models to derive the steady state thermal decay curves and use those curves to compute a thermal profile for an IC. FIGS. 5A and 5B show an example of such an alternative embodiment. This alternative embodiment may be used in situations in which no particular IC design is currently intended for fabrication, but certain expected designs will have certain expected features and hence may be used to create machine learning models. FIG. 5A shows an example of a method to train a machine learning model. In operation 301, a simulation system can construct a CPS model of a CPS which may represent one or more expected ICs in a system. The simulation system can generate thermal parameter data about this CPS (creating, for example, data that is similar to the data obtained in operation 71 in FIG. 2B). This data can be used as input features to be inputted into the machine learning model (e.g., a set of neural networks). In one embodiment, these input features can be derived from the data obtained in operation 71. The inputs can then be used in thermal CFD simulations to compute a set of thermal decay curves (such as a nominal decay curve and a set of location dependent decay curves); this set of thermal decay curves can then be stored for use a ground truth data to train a machine learning model, such as a set of one or more neural networks. In operation 305, the machine learning model is trained by using the inputs and the ground truth data to train the model, which may be a DeepONet neural network as shown in FIG. 5C; see the following web page for more information about DeepONet: arxiv.org/abs/1910.03193. Once the machine learning model is trained, it can be used to generate a set of thermal decay curves that are used at inference time to generate a thermal profile of the IC.

FIG. 5B shows an example of a method of the use of a trained neural network according to one embodiment. In operation 321, a simulation system can generate a set of input data (which is the same type of data used to train the neural network) for a given CPS; the set of input data describes the thermal parameters of the given CPS so that the trained neural network can generate the set of thermal decay curves for the given CPS. The set of input data is applied as an input in operation 323 to the trained neural network which produces the set of thermal decay curves. Then, in operation 325, the generated set of thermal decay curves can be used with a given power profile to compute NFEs and FFEs temperature values which are combined in operation 327 for each tile for which a thermal profile is desired. Operations 325 and 327 are repeated (as determined by operation 329 for each such tile until the method produces (in 331) the complete thermal profile for all desired tiles. The methods in FIGS. 5A and 5B can use the Deep-ONet neural network structure that is described in the literature (see, for example, arxiv.org/abs/1910.03193). The inputs (u) are the thermal parameters described above (e.g., see operation 71), and the output function can provide, once trained, the set of thermal decay curves.

Figure 6:
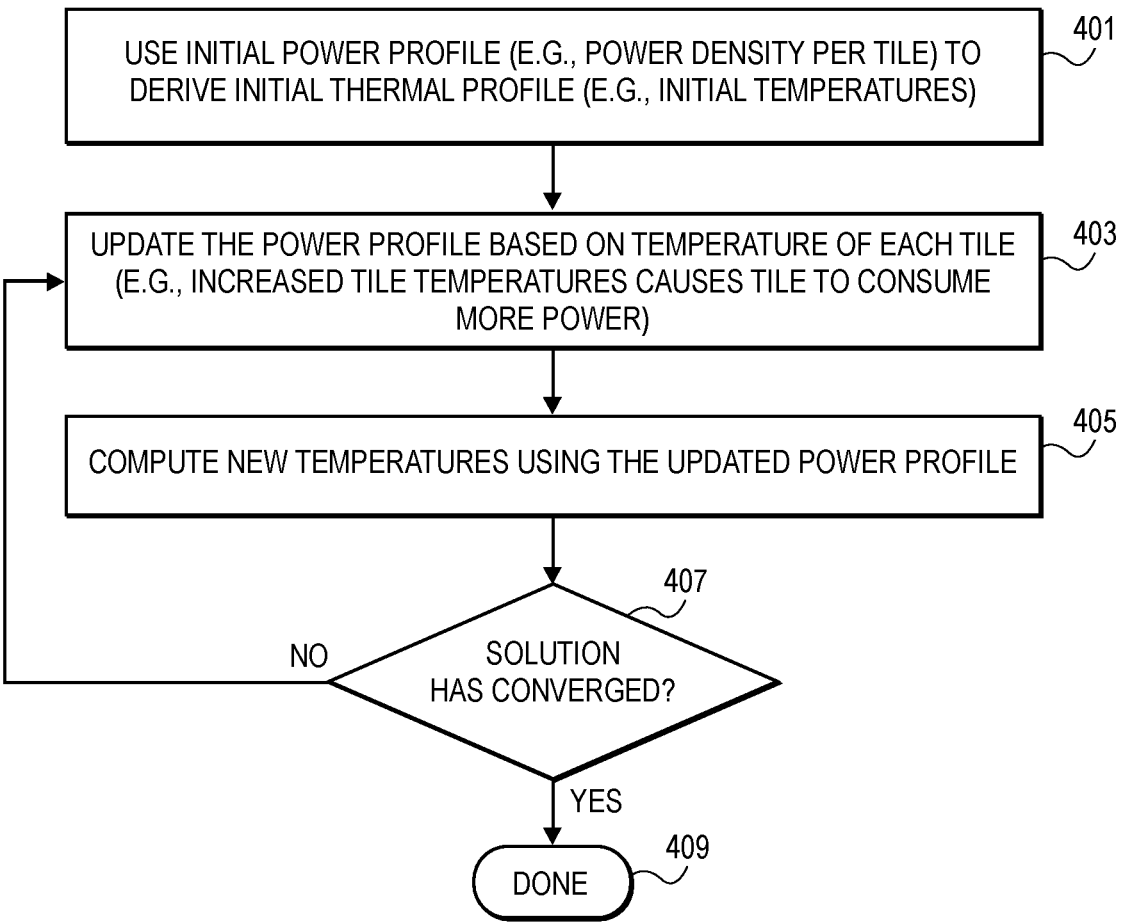
FIG. 6 shows an example of a method according to one embodiment to compute temperature values in an iterative loop to converge to a solution that is dependent upon the influence of tile temperatures on power consumed by those tiles.

In one embodiment, a generated thermal profile (e.g., a steady state thermal profile produced in operation 79 in FIG. 2B) can be used in an iteration that seeks to estimate the effect of the increase in temperatures in the IC on the power that is consumed by the IC (even though the power applied does not change, the increase in temperature causes the IC the consume more power that results in a further increase in temperature). FIG. 6 shows an example of a method that can perform this iteration. The output from operation 79 can provide the initial thermal profile in operation 401 in FIG. 6 (which is based on the initial power profile). In operation 403, the simulation system can use known methods to update the power profile based on the increase temperatures in the IC; there are known relationships between change in temperature and change in power consumed as a result of the increase in temperature, and these known relationships can be used in operation 403. Using this updated power profile (from operation 403), the operations 77 and 79 in the method in FIG. 2B can be used (in operation 405) to compute a new thermal profile (new set of temperatures) for the updated power profile. This process can be repeated if the solution is determined (in operation 407) to have not converged; the solution can be considered converged when successive solutions produce a difference in temperatures that fall below a threshold value or set of threshold values. Once the solution is considered converged, then the process is completed (409).

Figure 7:
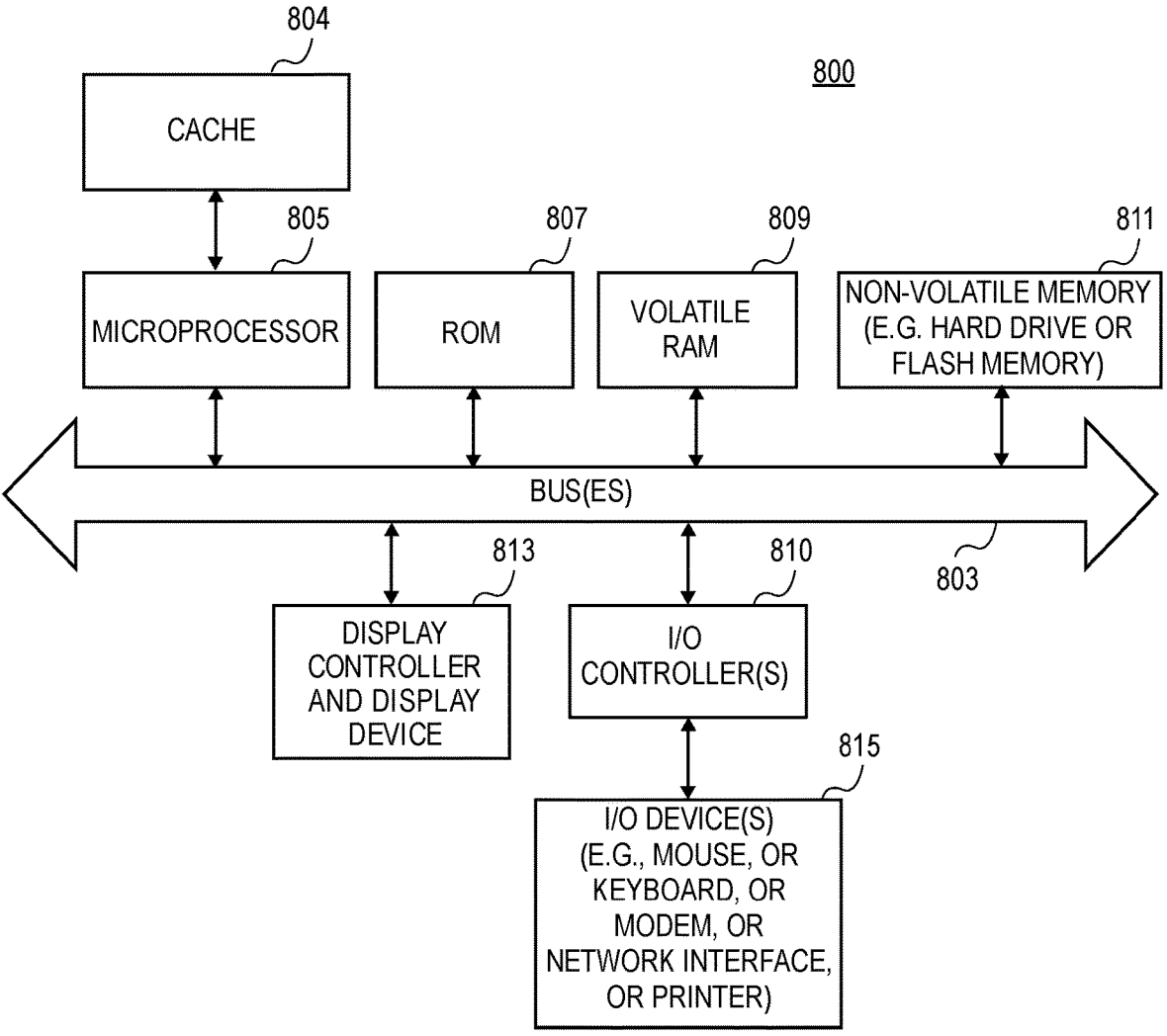
FIG. 7 show an example of a data processing system that can be used to implement one or more embodiments described herein.

FIG. 7 shows one example of a data processing system 800, which may be used with one embodiment. For example, the system 800 may be implemented to provide a system or device that performs any one of the methods described herein. Thus, the system 800 is an example of a simulation system, and the system 800 can execute the simulation software described herein. Note that while FIG. 7 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 7, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 7 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMS, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMS, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable computer program instructions which, when executed by a data processing system, cause the data processing system to perform a method, the method comprising:

characterizing a model of an integrated circuit (IC) to derive a set of thermal decay curves which comprise a nominal thermal decay curve and a set of location dependent thermal decay curves, the nominal thermal decay curve over a fine resolution of the model and the set of location dependent thermal decay curves over a coarse resolution of the model, a region of the IC being represented based on both the coarse resolution of the model and the fine resolution of the model;

receiving a power profile of the IC;

simulating a steady state thermal profile of the IC using the power profile, wherein the steady state thermal profile is simulated based on a combination of the nominal thermal decay curve and the set of location dependent thermal decay curves;

modifying the IC model based on a comparison of the simulated steady state thermal profile to design requirements; and outputting characteristics of the modified IC model to be used for manufacture of the IC.

2. The non-transitory machine readable medium as in claim 1, wherein the characterizing comprises a set of computational fluid dynamics (CFD) thermal simulations to derive steady state temperatures based on simulated power being applied to selected locations in the model of the IC.

3. The non-transitory machine readable medium as in claim 2, wherein the selected locations comprise one or more locations near a center of the IC.

4. The non-transitory machine readable medium as in claim 2, wherein the model of the IC is simplified to contain only three layers representing a substrate, interconnection layers and dielectric layers.

5. The non-transitory machine readable medium as in claim 2, wherein the set of thermal decay curves distinguish between near field thermal effects (NFEs) and far field thermal effects (FFEs), and wherein the NFEs are computed at a first resolution and the FFEs are computed at a second resolution, and the first resolution is finer grain than the second resolution.

6. The non-transitory machine readable medium as in claim 5, wherein computing the steady state thermal profile of the IC combines the NFEs and FFEs of a plurality of aggressors using linear superposition.

7. The non-transitory machine readable medium as in claim 6, wherein the FFEs depend on location relative to the IC, including location relative to one of a corner of the IC or an edge of the IC.

8. The non-transitory machine readable medium as in claim 7, wherein the NFEs are a function of distance from a victim location to a center of the IC.

9. The non-transitory machine readable medium as in claim 8, wherein a first FFE at a first location uses a first location dependent thermal decay curve computed for the first location, and a second FFE at a second location uses a second location dependent thermal decay curve computed for the second location, and wherein the first location dependent thermal decay curve is different than the second location dependent thermal decay curve.

10. The non-transitory machine readable medium as in claim 2, wherein the computing uses a trained set of one or more neural networks to compute the steady state thermal profile of the IC.

11. A machine implemented method, the method comprising:

> characterizing a model of an integrated circuit (IC) to derive a set of thermal decay curves which comprise a nominal thermal decay curve and a set of location dependent thermal decay curves, the nominal thermal decay curve over a fine resolution of the model and the set of location dependent thermal decay curves over a coarse resolution of the model, a region of the IC being represented based on both the coarse resolution of the model and the fine resolution of the model;

> receiving a power profile of the IC;
> simulating a steady state thermal profile of the IC using the power profile, wherein the steady state thermal profile is simulated based on a combination of the nominal thermal decay curve and the set of location dependent thermal decay curves;
> modifying the IC model based on a comparison of the simulated steady state thermal profile to design requirements; and
> outputting characteristics of the modified IC model to be used for manufacture of the IC.

12. The method as in claim 11, wherein the characterizing comprises a set of computational fluid dynamics (CFD) thermal simulations to derive steady state temperatures based on simulated power being applied to selected locations in the model of the IC.

13. The method as in claim 12, wherein the selected locations comprise one or more locations near a center of the IC.

14. The method as in claim 12, wherein the model of the IC is simplified to contain only three layers representing a substrate, interconnection layers and dielectric layers.

15. The method as in claim 12, wherein the set of thermal decay curves distinguish between near field thermal effects (NFEs) and far field thermal effects (FFEs), and wherein the NFEs are computed at a first resolution and the FFEs are computed at a second resolution, and the first resolution is finer grain than the second resolution.

16. The method as in claim 15, wherein computing the steady state thermal profile of the IC combines the NFEs and FFEs of a plurality of aggressors using linear superposition.

17. The method as in claim 16, wherein the FFEs depend on location relative to the IC, including location relative to one of a corner of the IC or an edge of the IC.

18. The method as in claim 17, wherein the NFEs are a function of distance from a victim location to a center of the IC.

19. The method as in claim 18, wherein a first FFE at a first location uses a first location dependent thermal decay curve computed for the first location, and a second FFE at a second location uses a second location dependent thermal decay curve computed for the second location, and wherein the first location dependent thermal decay curve is different than the second location dependent thermal decay curve.

20. The method as in claim 12, wherein the computing uses a trained set of one or more neural networks to compute the steady state thermal profile of the IC.

* * * * *